(12) United States Patent
Schuster et al.

(10) Patent No.: US 7,336,075 B2
(45) Date of Patent: Feb. 26, 2008

(54) MOUNTING DEVICE FOR MONITORING A LOCAL GRADIENT COIL UNIT IN A GRADIENT COIL SYSTEM

(75) Inventors: Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/620,161

(22) Filed: Jan. 5, 2007

(65) Prior Publication Data

US 2007/0182415 A1    Aug. 9, 2007

(30) Foreign Application Priority Data

Jan. 5, 2006   (DE)   ........... 10 2006 000 922

(51) Int. Cl.
*G01V 3/00*  (2006.01)
(52) U.S. Cl. ............... 324/318; 324/319
(58) Field of Classification Search ........ 324/318, 324/319, 321
See application file for complete search history.

(56) References Cited

U.S. PATENT DOCUMENTS

| | | | |
|---|---|---|---|
| 5,783,943 A * | 7/1998 | Mastandrea et al. | ...... 324/318 |
| 6,107,799 A | 8/2000 | Sellers et al. | |
| 6,777,936 B2 * | 8/2004 | Schaaf | ............... 324/318 |
| 6,864,683 B2 | 3/2005 | Schuster et al. | |
| 6,894,497 B2 | 5/2005 | Renz | |
| 7,256,581 B2 * | 8/2007 | Schuster et al. | ........ 324/318 |
| 2004/0106865 A1 | 6/2004 | Schuster et al. | |
| 2004/0158922 A1 * | 8/2004 | Eberler et al. | ......... 5/81.1 R |
| 2004/0239326 A1 * | 12/2004 | Kreischer | ............ 324/318 |

* cited by examiner

*Primary Examiner*—Louis M. Arana
(74) *Attorney, Agent, or Firm*—Schiff Hardin LLP

(57) ABSTRACT

A mounting device for a local gradient coil unit for mounting same in the examination area of a magnetic resonance unit has one or more guide rails, which are able to be arranged in the examination area, supporting the gradient coil unit, with a locator structure for positioning the gradient coil unit axially on both sides in a mounting position in the examination area, along which guide rail(s) the gradient coil unit slides until it reaches the axial mounting position. One or more fixing elements are fitted on the gradient coil unit for bracing the gradient coil unit in the examination area against the guide rail(s) in the mounting position.

14 Claims, 2 Drawing Sheets

MOUNTING DEVICE FOR MONITORING A LOCAL GRADIENT COIL UNIT IN A GRADIENT COIL SYSTEM

BACKGROUND OF THE INVENTION

1. Field of the Invention

The present invention relates to a mounting device for a local gradient coil unit for mounting thereof in a gradient coil system.

2. Description of the Prior Art

Magnetic resonance devices have been used for a considerable time in medicine and in biophysics for obtaining images from inside the body of an examination subject. Magnetic resonance tomography is based on the physical phenomenon of nuclear magnetic resonance. In this examination modality, the examination subject is exposed to a strong, constant magnetic field, causing the previously irregularly oriented nuclear spins of the atoms become aligned in the examination subject. Radio-frequency energy is used to excite these disordered nuclear spins to produce a particular oscillation (resonant frequency). In resonance tomography, this oscillation generates the actual high-frequency measurement or response signal for the imaging process. Reception coils are provided for receiving the measurement or response signal.

A prerequisite for image generation is precise information about the respective place of origin of the measurement or response signal in the examination subject. Location information or a location coding for the received measurement or response signals is required. This location information is obtained by using additional magnetic fields, so-called gradient fields. The gradient fields are generated using a gradient coil system along the three spatial directions of individual gradient coils. The gradient field superimposed on the basic field is such that the field strength and thus also the resonant frequency is different in each volume element. The basic structure and the function of a magnetic resonance system are adequately known.

The use of a local gradient coil unit is known for the examination of special areas of an examination subject, the head for example. This is incorporated into the permanently installed gradient coil system. To this end, it is possible to use an insertion device, as is described in the German patent application DE 102 29 489 A1. This device described therein has an arm arranged either on a transport carriage or a swivel mount, on which is located the gradient coil unit to be inserted, frequently also referred to as insert gradient coil. The arm travels into the examination area of the magnetic resonance unit, which is the gradient coil system in this case, which is usually provided with a lining on the inside wall, until the arm has reached a defined position. Depending on the embodiment, the arm can now remain in the examination area and it serves to secure the gradient coil unit during the examination. Alternatively, it is also possible after reaching the end position to use suitable attachment facilities provided in the examination area to attach the gradient coil unit, to release it from the arm and to retract the arm again.

This insertion or mounting device is relatively complex in design, since the arm must be adequately dimensioned because a local gradient coil unit can have a considerable weight and it sometimes needs to be supported over a considerable length until the end position is reached.

SUMMARY OF THE INVENTION

An object of the present invention is to provide a simple embodiment of a mounting device for a local gradient coil unit that makes possible a simple axially secured mounting of the gradient coil unit in the examination area.

This object is achieved in accordance with the invention by a mounting device having one or more guide rails, which are able to be arranged in the examination area, supporting the gradient coil unit, with a locator structure for positioning the gradient coil unit axially on both sides in a mounting position in the examination area, along which guide rail(s) the gradient coil unit slides until it reaches the axial mounting position, and one or more fixing elements fitted on the gradient coil unit for bracing the gradient coil unit in the examination area against the guide rail(s) in the mounting position.

The inventive mounting device provides for the use of one or more, preferably two, guide rails which for the purposes of seating a local gradient coil unit can be inserted either into the examination area and secured there, or that are permanently arranged as an integral component in the examination area. The term "examination area" describes the internal cylindrical bore or inner space or patient table area of the magnetic resonance unit, which is ultimately delimited by the internal lining of this space, which normally covers the permanently installed whole-body gradient coil. The guide rail(s) are thus secured to the inner lining. The guide rails preferably have a surface slide coating, preferably made of PTFE (Teflon®) and are formed in this case of, for example, CFK or GFK material, or are formed wholly of a slide material. The gradient coil unit to be used slides thereon, and thus is moved along the fixed guide rails until it reaches the mounting position. On each guide rail, according to the invention, a locator structure is provided that positions the gradient coil unit axially on both sides in a mounting position, in other words for axial fixing. Such axial fixing is needed because the strong magnetic fields and the forces resulting therefrom act on the gradient coil unit and can lead to an axial displacement or movement.

According to the invention, the mounting device also has fixing elements provided on the gradient coil unit which are used for bracing the gradient coil unit in the examination area against the guide rail(s) in the mounting position. The mounted gradient coil unit is thus seated on the guide rail or rails by way of which it secured axially while the radial fixing is achieved in a simple manner by way of the fixing or bracing media fitted on the gradient coil unit.

The mounting device according to the invention is thus constructed very simply; it merely has one or more, preferably two, guide rails, which are preferably already mounted permanently in the examination area. Furthermore, merely the fixing elements provided on the gradient coil unit are required, achieving the radial bracing in addition to the axial fixing by the guide rails.

According to a first embodiment of the invention, the locator structure for axially position, the gradient coil unit is designed as a surface depression on each guide rail having a length matched to the length of the gradient coil unit. An inclined plane (ramp) preferably is provided at the transition point with the depression, at least on the insertion side for the gradient coil unit. In this particularly simple embodiment of the invention, the gradient coil unit is pushed along the guide rails in the direction of the end or mounting position. During the sliding movement it glides automatically into the depressions which are implemented and dimensioned such that they then automatically effect the axial fixing in both directions when the gradient coil has moved into the depression along its entire length. This means that the gradient coil unit merely needs to be pushed into its end position to set it. Upon reaching this position, it is automatically fixed axially, after which it is merely the fixing elements for bracing against the guide rails which still need to be applied.

As an alternative to the use of depressions on the guide rails, it is also possible to implement the axial locator structure as a first stop, against which the gradient coil unit is pushed and which defines the end position, and a second stop which can be brought into a locking position, the distance between the stops being matched to the length of the gradient coil. The gradient coil unit is therefore slid along the guide rails as far as the first stop, during which slide movement it travels over the second stop which is in an inoperative position. When the first stop is reached the second stop is brought into the locking position, which can be done in a simple manual manner by swinging it upwardly or a similar action. In this case as well, a simple insertion with simultaneous axial fixing is achieved, using a minimum of actions in an extremely simple manner. The distance between the two stops can be adjustable in order to adapt to possible differences in length of different gradient coil units.

A combination of the two locking options, namely a depression and a retractable stop, is also possible. For example, a depression matched to the maximum length of a gradient coil unit that can be used can be provided on the guide rail. One or more stops, which each can be moved between an inoperative position and a locking position, can be provided along the length of the depression, and which are operated when a shorter gradient coil unit used. It is also conceivable to always use one end of the depression as a stop and to implement the axial fixing in the other direction by a stop that can, if necessary, be adjusted to allow movement and locking along the depression.

According to the invention, the fixing element or elements can be formed as cushion-like or bellows-like tensioning elements that can be reversibly expanded using a filler medium. For bracing purposes, a cushion-like or bellows-like tensioning element needs simply to be filled with the filler medium, which can be liquid or gaseous, until an adequate fill pressure is achieved, which generates an adequate tensioning force. The tensioning element or elements advantageously has/have connectors for connection of a feed line for the liquid or gaseous filler medium. The connection can be made before the gradient coil unit is inserted, or when it has reached the mounting position. It is also conceivable for such a fillable tensioning element to have a fixed feed line that extends over a certain length, which is then coupled to a supply line that leads to a pump or the like. It is particularly advantageous to provide the connector for connection to a cooling circuit of the magnetic resonance unit housing the gradient coil unit. If the cushion-like tensioning elements thus are connected to the cooling circuit, normally a cooling water circuit, of the magnetic resonance unit, then the coil is always fixed when the cooling water pump is in operation. Alternatively, it would also be conceivable to use a separate filler medium source, for example, a separate water pump or air pump.

As an alternative to using the reversibly fillable tensioning elements, the fixing element or elements can be formed as mechanical tensioning elements, which can be brought into the tensioning position by a manual or electrical actuation element, preferably in the form of one or more tensioning wedges can be moved, for example, by a spindle drive that can be operated with a wrench or an electrical screwdriver and brought into the tensioning position.

DESCRIPTION OF THE PREFERRED EMBODIMENTS

Figure 1:
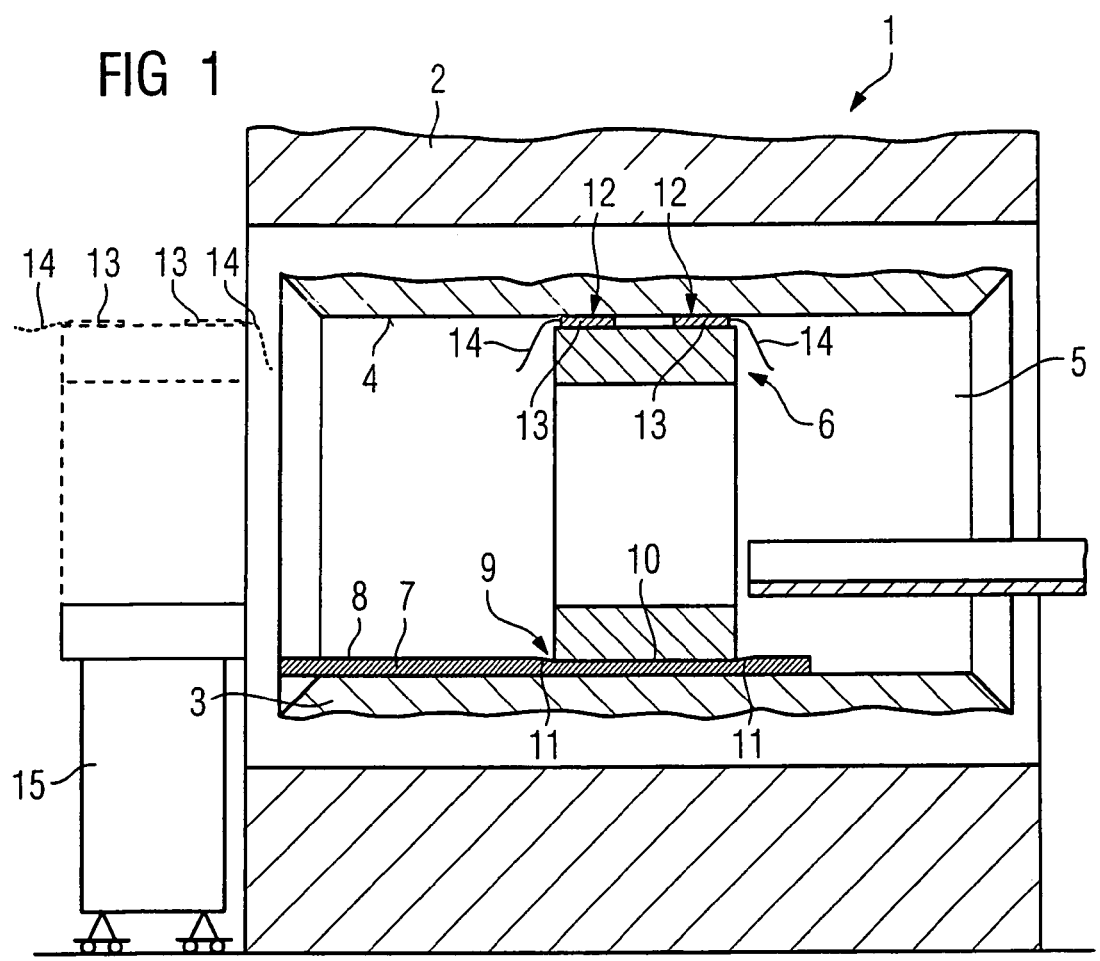
FIG. 1 schematically illustrates a magnetic resonance unit with a gradient coil unit fixed by way of a mounting device according to the invention.
Figure 2:
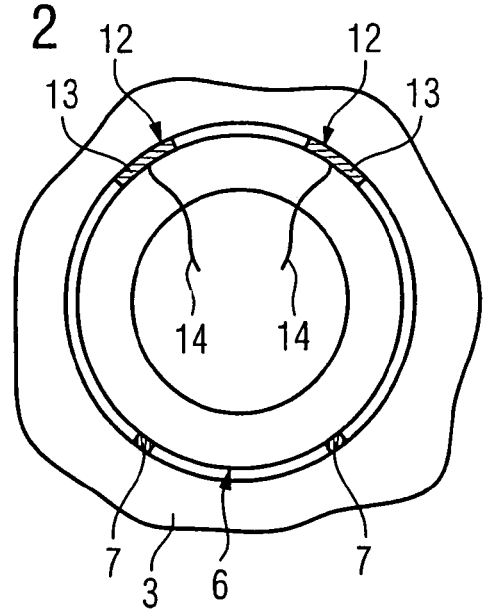
FIG. 2 shows a front view of the fixed gradient coil unit of FIG. 1.

FIG. 1 shows a magnetic resonance unit 1, having a magnet 2 which serves to generate a basic or main magnetic field and that essentially has a hollow cylindrical shape and is made of superconducting material. In the cylindrical recess or bore of the magnet 2 is situated a fixed mounted gradient coil system 3 that likewise essentially has a hollow cylindrical shape and that serves to generate gradient fields. The inner wall of the gradient coil system 3 is normally lined with a lining 4.

The mounting of a gradient coil unit 6 to be inserted into the examination area 5, delimited by the lining 4, is performed using a mounting device according to the invention. This mounting device has guide rails 7 secured to the gradient coil system 3 or to the lining 4. In the example illustrated, two such guide rails 7 are secured to the lining 4 in the lower region of the examination area 5. These guide rails 7 are formed, for example, of CFK or GFK material and are provided with a slide coating 8, made of PTFE for example, on the top side. They each have a locator structure 9 for axially positioning or fixing the gradient coil unit 6 in the mounting position. In the embodiment shown in FIG. 1, the locator structure 9 is a depression 10 that has ramps 11 on both sides at the transition points with the raised rail sections. The length of the depression 10—defined by the lower ramp ends at the base of the depression 10—is calculated in this situation that to essentially correspond to the length of the gradient coil unit 6. The axial fixing of the gradient coil unit 6 provided in both directions is achieved by this depression 10.

In order to radially fix the gradient coil unit 6, fixing elements 12 in the form of a number of, here a total of four, tensioning elements 13 are additionally provided. These tensioning elements 13 are cushion-like or bellows-like tensioning elements, which can be reversibly expanded with a filler medium. To this end, each tensioning element 13 is or can be connected to a feed line 14 which leads to a feed facility not shown in more detail, for example the cooling water circuit of the magnetic resonance unit 1. If the gradient coil unit 6 that is used is to be finally fixed after reaching the end position defined by the depression 10, the tensioning elements 13 are filled, for example just with cooling water or a compressed gas or air such that they bear firmly on the adjacent lining 4. In this situation, the gradient coil unit 6 is braced downwardly against the guide rails 7. The gradient coil unit 6 is thus fixed both axially and radially.

In order to insert such a gradient coil unit 6, which is seen in the withdrawn position in FIG. 1, the gradient coil unit 6 is first placed on a transport carriage 15 which is then moved up to the magnetic resonance unit 1. The height of the transport carriage is then adjusted such that the gradient coil unit 6, which is depicted here by a broken line, is positioned with its underside precisely at the height of the levels of the guide rails 7. The gradient coil unit 6 to be inserted is then pushed manually by a suitable transfer facility, which connects flush with the guide rails 7, onto and along the guide rails 7 until it reaches the depression 10. The tensioning elements 13 are not yet filled up to this point; they lie (see the gradient coil unit 6 depicted by a broken line) emptied on top of the gradient coil unit. Only when the depression 10 is reached will they be expanded, after previously having been connected to the filler medium feed.

Figure 3:
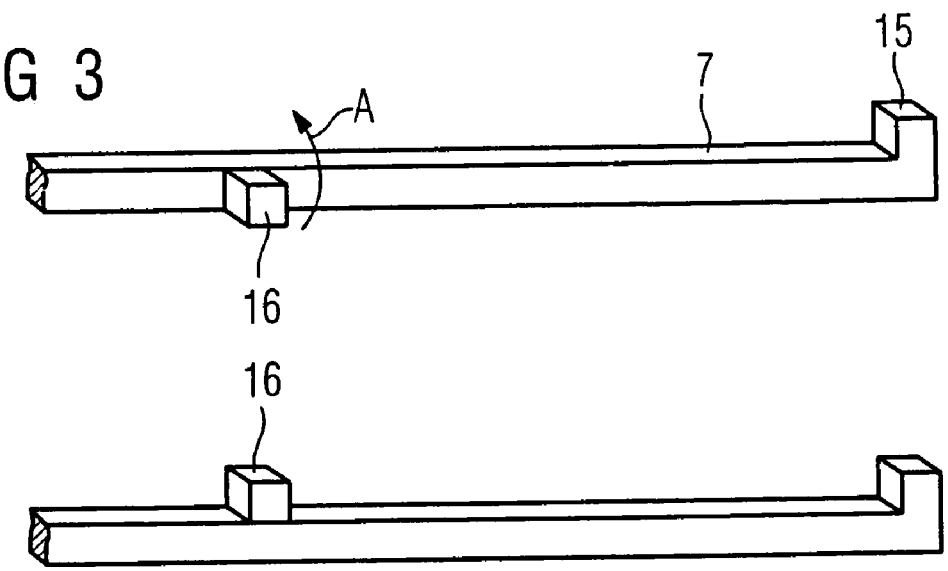
FIG. 3 shows a further embodiment of a guide rail.

FIG. 3 shows a further possible embodiment of a guide rail 7. There is no depression in this case, but merely a first stop 15, against which the gradient coil unit 6 is pushed. In addition, a second stop 16 is provided which can be swung upwardly, from an inoperative position swiveled to the side shown above in FIG. 3, into the locking position shown below in FIG. 3, as indicated by the arrow A. The gradient coil unit 6 is therefore first slid against the first stop 15, after which the second stop 16 is swung upwardly, held there by a suitable lock and thus effecting the axial fixing on this side. Here again the distance between the two stops 15, 16 is matched to the length of the gradient coil unit 6. It would be conceivable to design the second stop 16 (possibly also the first stop 15) to be capable of moving along the guide rail 7 such that where appropriate gradient coil units 6 of different lengths can be locked, or to arrange a number of such swiveling second stops distributed along the length of the guide rail 7.

In order to enable gradient coil units 6 of different lengths to be accommodated, it would also be conceivable with regard to one embodiment of a guide rail, as shown in FIG. 1, to provide one or more such swiveling stops in the depression, which can be brought into the locking position as required depending on the actual length of the gradient coil unit to be inserted.

Figure 4:
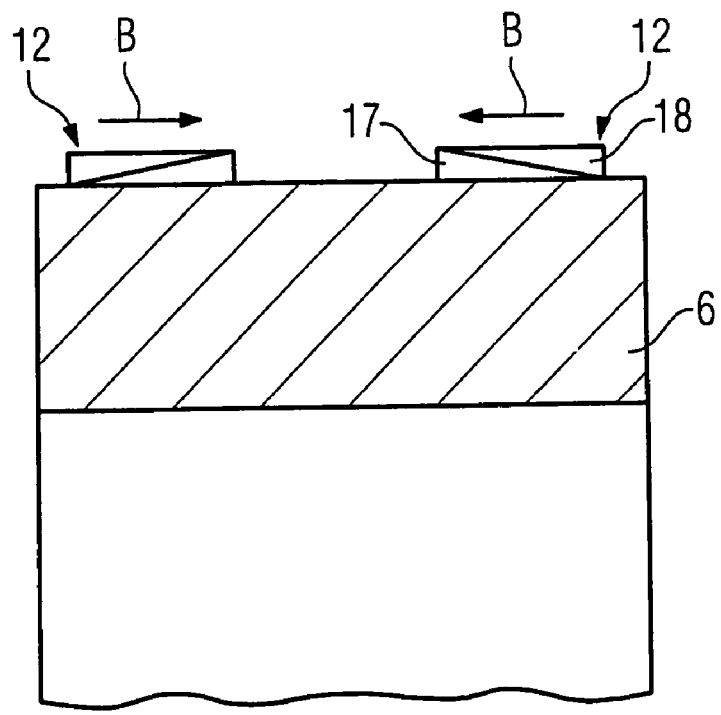
FIG. 4 shows a further embodiment of the fixing elements.

FIG. 4 shows a further embodiment of the fixing elements 12. These are implemented as mechanical tensioning elements formed by two wedges 17, 18, with the wedge 17 being located in a fixed position on the gradient coil unit 6 while the wedge 18, as represented by the respective arrows B, being movable relative to the wedge 17. To effect bracing, the respective wedges 18 are pushed in the direction of the respective arrows B and so as to ride up onto the wedges 17, thereby bracing the gradient coil unit 6. The wedge motion can be achieved, for example, by a spindle guide, driven for example by a wrench or the like or a motorized rotator.

Although modifications and changes may be suggested by those skilled in the art, it is the intention of the inventors to embody within the patent warranted hereon all changes and modifications as reasonably and properly come within the scope of their contribution to the art.

We claim:

1. A mounting device for mounting a local gradient coil unit in an examination area of a magnetic resonance unit comprising:
    at least one guide rail disposed in said examination area configured to movably support a gradient coil unit thereon;
    said at least one guide rail comprising a locator structure that locates said local gradient coil unit axially at both sides thereof in a mounting position in the examination area, said local gradient coil unit being slidable along said at least one guide rail until reaching said locator structure in said mounting position; and
    at least one fixing element disposed on said gradient coil unit that braces said gradient coil unit in said examination area against said at least one guide rail in said mounting position.

2. A mounting device as claimed in claim 1 wherein said locator structure comprises a depression in a surface of said at least one guide rail.

3. A mounting device as claimed in claim 2 wherein said depression has an insertion side that is first encountered by said local gradient coil unit as said local gradient coil unit is slid along said at least one guide rail, said depression comprising a ramp at a transition point between said depression and said at least one guide rail at said insertion side.

4. A mounting device as claimed in claim 1 wherein said local gradient coil unit has a first side that enters first into said examination area as said local gradient coil unit is slid along said at least one guide rail, and a second side that enters second said examination area as said local gradient coil unit is slid along said at least one guide rail, and wherein said locator structure comprises a first stop, against which said first side of said gradient coil unit rests in said mounting position, and a second stop movable from a standby position, at which said second stop does not interact with said local gradient coil unit, and a locking position at which second stop is adjacent said second side of said local gradient coil unit in said mounting position.

5. A mounting device as claimed in claim 4 wherein at least one of said first stop and said second stop is axially movable relative to the other to adjust a spacing between said first stop and said second stop.

6. A mounting device as claimed in claim 1 wherein said at least one fixing element comprises an expandable tensioning element, selected from the group consisting of cushion-like tensioning elements and bellows-like tensioning elements, that is reversibly expandable by charging and discharging with a filler medium.

7. A mounting device as claimed in claim 6 wherein said filler medium is a fluid filler medium, and wherein said at least one fixing element comprises a connection for a feed line for said fluid medium.

8. A mounting device as claimed in claim 6 wherein said magnetic resonance unit comprises a cooling circuit with a coolant flowing therein, and wherein said connection is configured to communicate an interior of said tensioning element with said cooling circuit to use said coolant as said filler medium.

9. A mounting device as claimed in claim 1 wherein said at least one fixing element comprises a mechanical tensioning element and an actuator connected thereto to move said mechanical tensioning element between a non-tensioning position and a tensioning position, said actuator being selected from the group consisting of manual actuators and electrical actuators.

10. A mounting device as claimed in claim 9 wherein said mechanical tensioning element is at least one wedge.

11. A mounting device as claimed in claim 1 wherein said at least one guide rail has a friction-reducing slide coating thereon.

12. A mounting device as claimed in claim 11 wherein said slide coating comprises PTFE.

13. A mounting device as claimed in claim 1 wherein said at least one guide rail is comprised of a friction-reducing slide material.

14. A mounting device as claimed in claim 13 wherein said slide material is PTFE.

* * * * *